US012559836B2

(12) United States Patent
Haddadin et al.

(10) Patent No.: US 12,559,836 B2
(45) Date of Patent: Feb. 24, 2026

(54) BOTTOM UP MOLYBDENUM GAPFILL

(71) Applicant: Applied Materials, Inc., Santa Clara, CA (US)

(72) Inventors: Rand Haddadin, Gilbert, AZ (US); Kunal Bhatnagar, Chandler, AZ (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/877,310

(22) Filed: Jul. 29, 2022

(65) Prior Publication Data

US 2024/0035149 A1 Feb. 1, 2024

(51) Int. Cl.

| *C23C 16/04* | (2006.01) |
| *C23C 16/08* | (2006.01) |
| *C23C 16/56* | (2006.01) |
| *H10B 12/00* | (2023.01) |

(52) U.S. Cl.
CPC ............ *C23C 16/045* (2013.01); *C23C 16/08* (2013.01); *C23C 16/56* (2013.01); *H10B 12/02* (2023.02)

(58) Field of Classification Search
CPC ....... C23C 16/045; C23C 16/08; C23C 16/56; H10B 12/02
See application file for complete search history.

(56) References Cited

U.S. PATENT DOCUMENTS

| 6,534,117 B1 | 3/2003 | Yoshio et al. |
| 8,828,863 B1 | 9/2014 | Lee et al. |

| 2012/0064715 A1 | 3/2012 | Lin et al. |
| 2013/0171822 A1 | 7/2013 | Chandrashekar et al. |
| 2013/0196065 A1* | 8/2013 | Heys .................... C23C 16/405 |
| | | 427/255.6 |
| 2014/0097538 A1 | 4/2014 | Zhao et al. |
| 2016/0343612 A1 | 11/2016 | Wang et al. |
| 2018/0294187 A1 | 10/2018 | Thombare et al. |
| 2019/0067003 A1 | 2/2019 | Zope et al. |
| 2019/0067014 A1* | 2/2019 | Shrestha .......... H01L 21/76877 |
| 2020/0095674 A1 | 3/2020 | Saly et al. |
| 2020/0303250 A1 | 9/2020 | Cen et al. |
| 2021/0125832 A1 | 4/2021 | Bhatnagar et al. |
| 2021/0320034 A1 | 10/2021 | Lei et al. |
| 2022/0020641 A1 | 1/2022 | Chandrashekar et al. |

FOREIGN PATENT DOCUMENTS

| WO | 2020118100 A1 | 6/2020 |
| WO | 2021178399 A1 | 9/2021 |

OTHER PUBLICATIONS

U.S. Appl. No. 17/714,510, filed Apr. 6, 2022, 25 pages.
PCT International Search Report and Written Opinion in PCT/US2023/017544 mailed Jul. 31, 2023, 10 pages.
PCT International Search Report and Written Opinion in PCT/US2023/028529 mailed Nov. 13, 2023, 11 pages.

* cited by examiner

*Primary Examiner* — Michael G Miller
(74) *Attorney, Agent, or Firm* — Servilla Whitney LLC

(57) ABSTRACT

Embodiments of the disclosure relate to methods for molybdenum gapfill. Additional embodiments provide a method of forming a molybdenum gapfill without substantial voids. Some embodiments of the disclosure are relevant for higher aspect ratio features including DRAM memory cells.

20 Claims, 3 Drawing Sheets

<u>100</u>

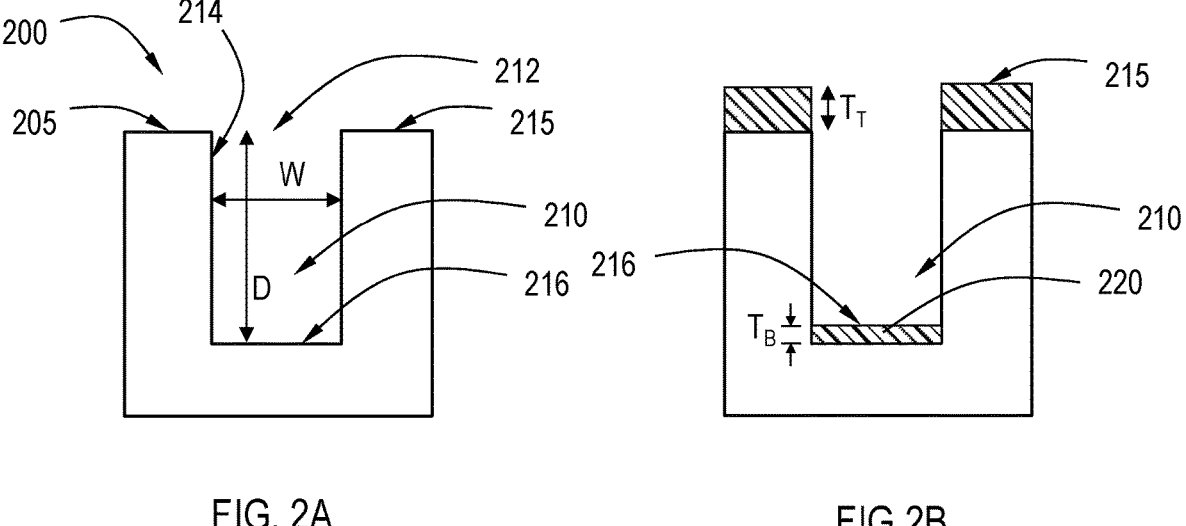
FIG. 2A
FIG.2B
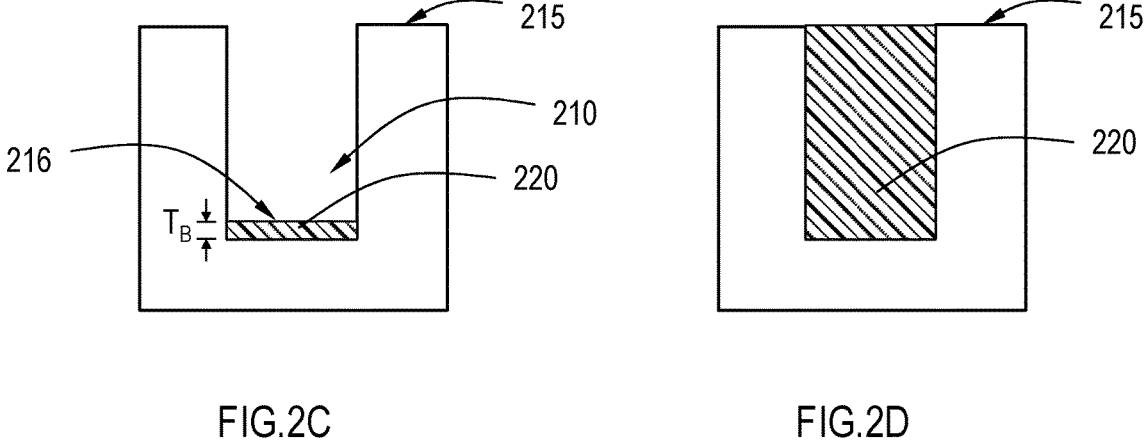
FIG.2C
FIG.2D

300

BOTTOM UP MOLYBDENUM GAPFILL

TECHNICAL FIELD

Embodiments of the present disclosure pertain to methods for deposition of molybdenum films within substrate features. More particularly, embodiments of the disclosure are directed to methods which provide bottom-up gapfill by a cyclic deposition-etch process.

BACKGROUND

Gapfill process are integral to several semiconductor manufacturing processes. A gapfill process can be used to fill a gap (or feature) with an insulating or conducting material. For example, shallow trench isolation, inter-metal dielectric layers, passivation layers, dummy gate, are all typically implemented by gapfill processes.

As device geometries continue to shrink (e.g., critical dimensions <20 nm, <10 nm, and beyond) and thermal budgets are reduced, defect-free filling of spaces becomes increasingly difficult due to the limitations of conventional deposition processes.

Most conventional deposition methods, especially chemical vapor deposition methods, deposit more material on the substrate surface than within the feature, particularly near the bottom of a feature.

As a result, the film on the substrate surface must be removed through an etch process after the gapfill deposition is complete. This additional processing step lowers throughput, increasing the cost of manufacture.

Other gapfill methods rely on atomic layer deposition to form metal gapfill materials. These methods typically produce conformal films on all the substrate surfaces. Accordingly, these methods also require an etch of material deposited outside the feature, but they also often produce gapfill with a seam in the middle as films form from the sidewalls and meet in the middle.

Accordingly, there is a need for gapfill methods which allow for greater throughput and deposit in a bottom-up manner to avoid defects in the gapfill.

SUMMARY

One or more embodiments of the disclosure are directed to a method of depositing molybdenum gapfill. The method comprises exposing a substrate surface with at least one feature formed therein to a first molybdenum precursor and a reductant to form a first gapfill within the at least one feature. The at least one feature has an opening, two sidewalls and extends a depth from a top surface to a bottom. The substrate surface is exposed to a second molybdenum halide precursor to remove a portion of the first gapfill, and the formation of the first gapfill is repeated.

Additional embodiments of the disclosure are directed to a method of depositing molybdenum gapfill. The method comprises exposing a substrate surface with at least one feature formed therein to $MoO_2Cl_2$ and $H_2$ to form a first gapfill within the at least one feature. The at least one feature has an opening, two sidewalls and extends a depth from a top surface to a bottom. The feature has an aspect ratio greater than or equal to about 100:1. The substrate surface is exposed to $MoCl_5$ to remove a portion of the first gapfill, and formation and removal of the first gapfill are repeated to entirely fill the at least one feature.

BRIEF DESCRIPTION OF THE DRAWINGS

So that the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

FIGS. 2A-2D illustrate a cross-sectional view of a substrate during processing according to one or more embodiments.

DETAILED DESCRIPTION

Figure 1:
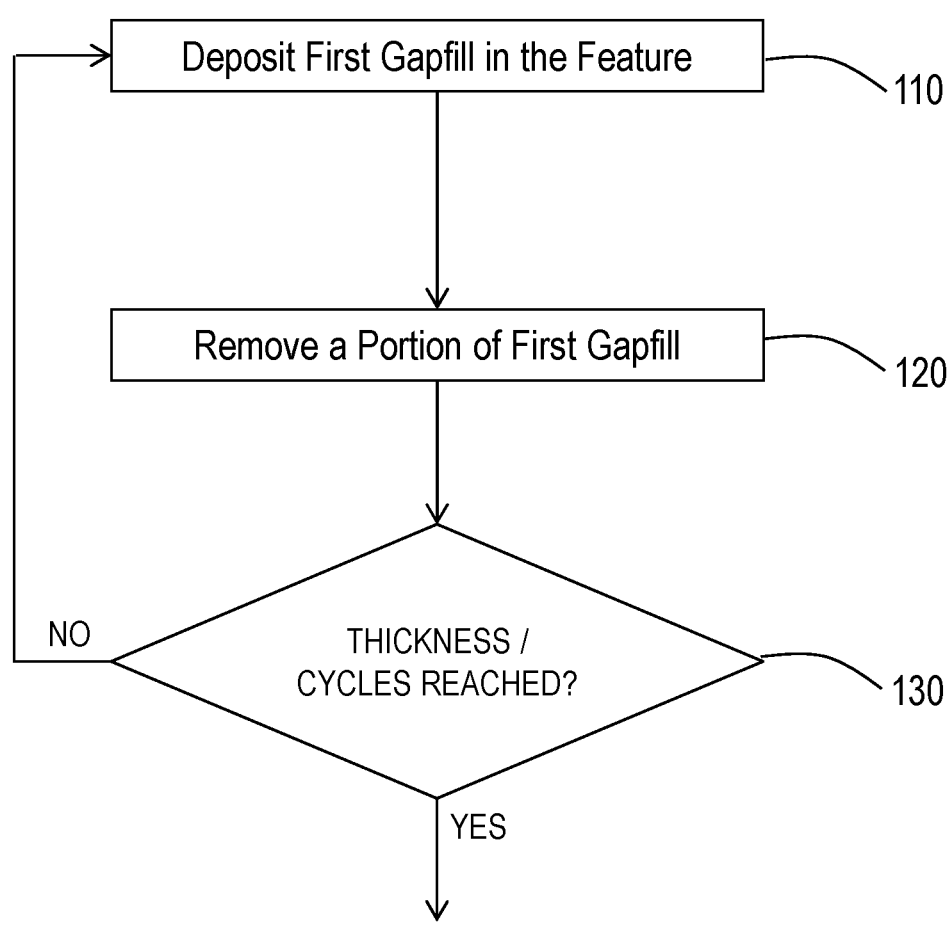
FIG. 1 illustrates a process flow diagram of a deposition method according to one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "about" as used herein means approximately or nearly and in the context of a numerical value or range set forth means a variation of ±15% or less, of the numerical value. For example, a value differing by ±14%, ±10%, ±5%, ±2%, ±1%, ±0.5%, or ±0.1% would satisfy the definition of about.

As used in this specification and the appended claims, the term "substrate" or "wafer" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

A "substrate surface" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

The substrate surface may have one or more features formed therein, one or more layers formed thereon, and combinations thereof. The shape of the feature can be any suitable shape including, but not limited to, peaks, trenches, holes and vias (circular or polygonal). As used in this regard, the term "feature" refers to any intentional surface irregularity. Suitable examples of features include but are not limited to trenches, which have a top, two sidewalls and a bottom extending into the substrate, and vias which have one or more sidewall extending into the substrate to a bottom.

The term "on" indicates that there is direct contact between elements. The term "directly on" indicates that there is direct contact between elements with no intervening elements.

As used in this specification and the appended claims, the terms "precursor", "reactant", "reactive gas" and the like are used interchangeably to refer to any gaseous species that can react with the substrate surface.

Embodiments of the disclosure advantageously provide methods for depositing molybdenum gapfill in a bottom-up fashion. Further embodiments advantageously provide methods of depositing gapfill with reduced defects (e.g., voids).

The embodiments of the disclosure are described by way of the Figures, which illustrate processes and substrates in accordance with one or more embodiments of the disclosure. The processes, schema and resulting substrates shown are merely illustrative of the disclosed processes, and the skilled artisan will recognize that the disclosed processes are not limited to the illustrated applications.

Referring to FIGS. 1-2C, the disclosure relates to a method 100 of depositing a molybdenum gapfill. FIG. 1 depicts a process flow diagram of a deposition method 100 in accordance with one or more embodiment of the present disclosure. FIGS. 2A-2D depict a substrate 200 during processing according to one or more embodiment of the present disclosure.

FIG. 2A illustrates a substrate 200 with a substrate surface 205. As identified above, the substrate surface refers to the exposed surface of the substrate upon which a layer may be formed. The substrate surface 205 has at least one feature 210 formed therein. While only a single feature is shown in the Figures, one skilled in the art will recognize that a plurality of features will be affected by the disclosed methods in a similar manner.

The at least one feature 210 has an opening 212 with a width W. The opening 212 is formed in a top surface 215 of the substrate 200. The feature 210 also has one or more sidewall 214 and extends a depth D from the top surface 215 to a bottom 216. While straight, vertical sidewalls are shown in the Figures, the disclosed methods may also be performed on slanted, irregular or reentrant sidewalls.

In some embodiments, the width W of the opening 212 is greater than or equal to about 10 nm, greater than or equal to about 15 nm, greater than or equal to about 20 nm, greater than or equal to about 25 nm, greater than or equal to about 30 nm, or greater than or equal to about 35 nm. In some embodiments, the width W is in a range of about 5 nm to about 15 nm, or in a range of about 10 nm to about 35 nm.

In some embodiments, the depth D of the feature 210 is greater than or equal to about 50 nm, greater than or equal to about 75 nm, greater than or equal to about 100 nm, greater than or equal to about 150 nm, greater than or equal to about 200 nm, or greater than or equal to about 250 nm. In some embodiments, the depth D is in a range of about 100 nm to about 200 nm, or in a range of about 200 nm to about 250 nm.

Those skilled in the art will recognize the increasing challenge of depositing metal gapfill in features of narrowing width (also known as critical dimension (CD)) and/or increasing depth. The aspect ratio of the at least one feature 210 is defined as the depth D of the feature 210 divided by the width W. In some embodiments, the at least one feature has an aspect ratio (D:W) greater than or equal to about 20:1, greater than or equal to about 50:1 or greater than or equal to about 100:1.

As identified above, in some embodiments, the substrate 200 contains a plurality of features 210. Some embodiments of the disclosure advantageously provide molybdenum gapfill for the formation of a DRAM memory cell. Stated differently, in some embodiments, the at least one feature forms a memory cell of DRAM.

Referring to FIGS. 1 and 2B, the method 100 begins with operation 110. At 110, a first gapfill 220 is formed on the substrate surface 205 within the at least one feature 210. In some embodiments, as shown in FIG. 2B, the first gapfill 220 is deposited on the top surface 215 and the bottom 216. While it is believed that at least some gapfill material is formed on the sidewall 214, no sidewall deposition is shown in the Figures for clarity.

At operation 110, the first gapfill 220 is formed by exposing the substrate surface to a first molybdenum precursor and a reductant. In some embodiments, the first molybdenum precursor and the reductant are exposed to the substrate simultaneously. In some embodiments, both the first molybdenum precursor and the reductant are flowed into the processing space above the substrate constantly. In some embodiments, the first molybdenum precursor is flowed constantly while the reductant is pulsed or flowed intermittently.

In some embodiments, the first molybdenum precursor comprises a molybdenum oxyhalide. In some embodiments, the first molybdenum precursor comprises or consists essentially of $MoO_2Cl_2$. The reductant may be any suitable reductant. In some embodiments, the reductant comprises or consists essentially of hydrogen gas ($H_2$). As used in this regard, a process gas which "consists essentially of" a stated reactant comprises greater than about 95%, greater than about 98%, greater than about 99%, or greater than about 99.5% of the stated reactant on a molar basis, excluding any inert diluent or carrier gases.

In some embodiments, the first gapfill 220 has a top thickness $T_T$ on the top surface 215 and a bottom thickness $T_B$ on the bottom 216. In some embodiments, the top thickness $T_T$ is greater than the bottom thickness $T_B$. In some embodiments, the top thickness $T_T$ is at least 20 Å. In some embodiments, the bottom thickness $T_B$ is at least 10 Å. In some embodiments, the bottom thickness $T_B$ is in a range of about 10 Å to about 50 Å.

In some embodiments, operation 110 represents chemical vapor deposition (CVD) process. In some embodiments, the temperature of the CVD process is in a range of about 450° C. to about 600° C., or in a range of about 500° C. to about 600° C. In some embodiments, the CVD process is performed without plasma.

The method 100 continues to operation 120 after formation of the first gapfill 220. In some embodiments, the substrate surface 205 is purged of any remaining reactant gases before proceeding to operation 120.

Referring to FIG. 2C, the method 100 continues at operation 120 where the substrate surface 205 is exposed to a second molybdenum halide precursor to remove a portion of the first gapfill 220. In some embodiments, the thickness of the first gapfill 220 on the top surface 215 is reduced by a greater amount than the thickness of the first gapfill on the bottom surface 216. In some embodiments, the first gapfill 220 is entirely removed from the top surface 215. In some embodiments, exposure to the second molybdenum halide removes a thickness of first gapfill in a range of about 10 Å to about 50 Å.

Without being bound by theory, one possible explanation is that since the top surface is more exposed to the second molybdenum halide, the first gapfill on the top surface is etched more readily than the first gapfill at the bottom of the feature which is better protected.

The second molybdenum halide can be any suitable compound which reacts with first gapfill to etch/remove the first gapfill. The second molybdenum halide contains one or more halide ligand. In some embodiments, the second molybdenum halide comprises one or more of $MoCl_5$ or $MoF_6$. In some embodiments, the second molybdenum halide consists essentially of $MoCl_5$.

In some embodiments, the second molybdenum halide is delivered from a heated ampoule with a carrier gas. The carrier gas can be any suitably inert gas that does not react with or otherwise alter the first metal halide. In some embodiments, the carrier gas comprises argon. In some embodiments, the ampoule is heated to a temperature in a range of about 90° C. to about 105° C.

After a predetermined quantity of first gapfill has been removed or a predetermined time period of exposure to the second molybdenum halide precursor has elapsed, the substrate surface 205 is purged of any remaining reactant gases before proceeding to decision point 130.

At decision point 130, it is determined whether the first gapfill 220 has achieved a predetermined thickness. If so, the method 100 ends. If not, the method 100 returns to operation 110 to form additional first gapfill 220. The cycles of deposition (operation 110) and etch (operation 120) are repeated until the predetermined thickness of the first gapfill 220 is achieved.

Referring to FIG. 2D, in some embodiments, the cycles of deposition and etch are repeated to fill the entire depth D of the at least one feature 210. In some embodiments, the number of dep-etch cycles is in a range of about 200 to about 400 cycles or in a range of about 250 to about 350 cycles.

The inventors have surprisingly found that by using cycles of deposition and etch, rather than simply an extended deposition operation, the first gapfill 220 can be formed without closing off the opening of the at least one feature. Without being bound by theory, it is believed that because the etch operation 120 removes more material from the top surface 215 than the bottom surface 216 the inventors are able to fill features with higher aspect ratios without "pinching off" the opening or forming voids within the feature. In some embodiments, the method 100 forms a first gapfill without substantial voids. In this regard a "substantial" void is greater than or equal to 1 nm in width. In some embodiments, the first gapfill is formed within the at least one feature 210 without any substantial seam. In this regard a "substantial" seam is less than or equal to 1 nm in width.

Further, the disclosed methods advantageously form the first gapfill 220 in a "bottom-up" fashion. A 'bottom-up fashion" means that the method 100 accumulates little to no first gapfill 220 on the top surface 215 and/or the sidewall 214, but rather that the formation of the first gapfill 220 occurs primarily on the bottom 216. Accordingly, the first gapfill 220 grows from the bottom 216 of the at least one feature 210 up.

In some embodiments, the first gapfill 220 is deposited in a non-conformal fashion. In some embodiments, the first gapfill 220 is etched in a non-conformal fashion. A "non-conformal fashion" means that the material is deposited or etched with a variable thickness (formed or removed) across the substrate surface 205. For example, in some embodiments, the thickness of the first gapfill removed from the bottom 216 may be lower than the thickness of the first gapfill 220 removed from the top surface 215.

In some embodiments, the processing conditions of the method 100 may be controlled. In some embodiments, the processing environment is maintained at a predetermined pressure during method 100. In some embodiments, the pressure is maintained in a range of about 5 Torr to about 35 Torr or in a range of about 25 Torr to about 50 Torr.

Figure 3:
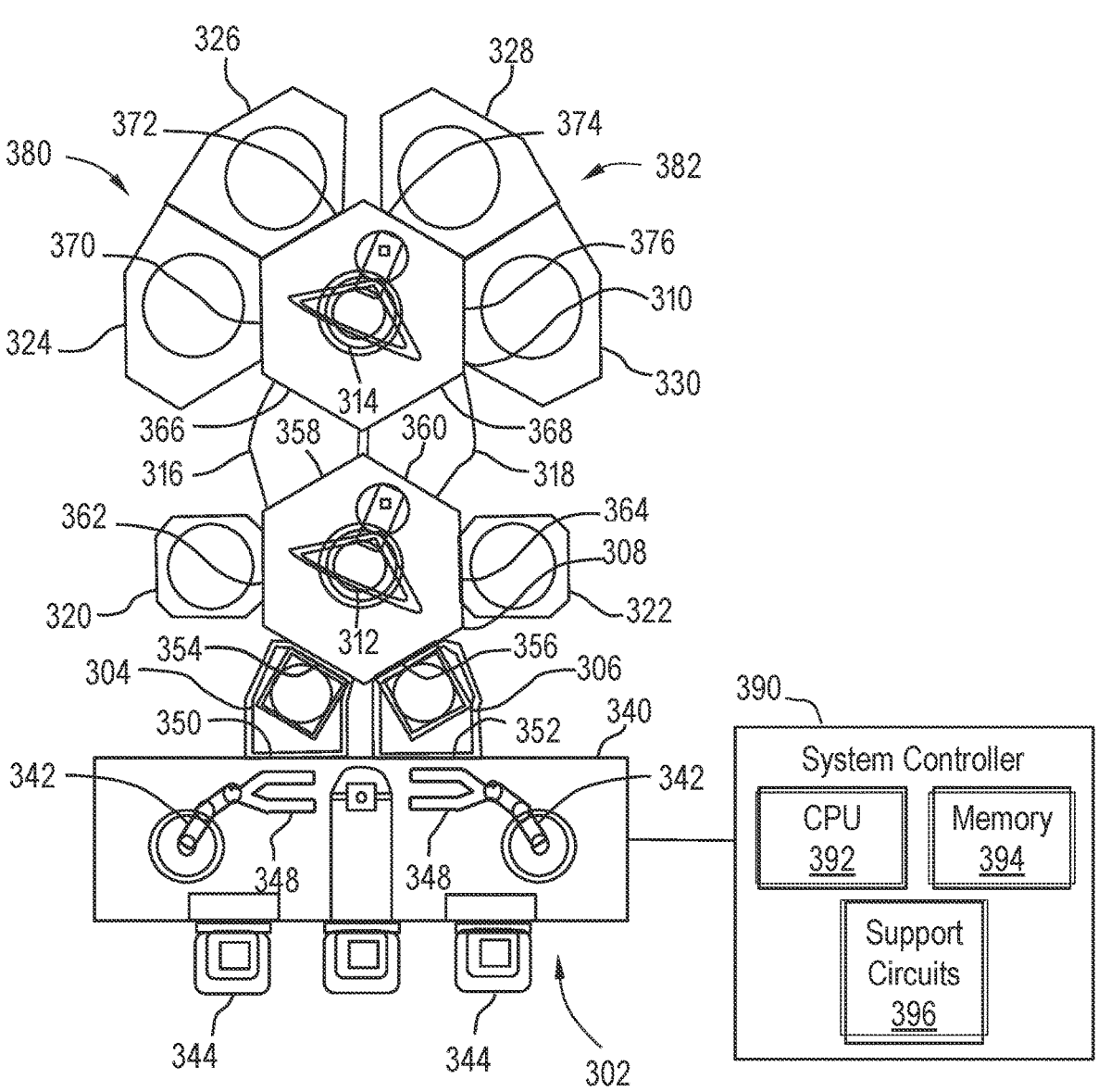
FIG. 3 illustrates a schematic top-view diagram of a multi-chamber processing system according to one or more embodiments.

FIG. 3 is a schematic top-view diagram of an exemplary multi-chamber processing system 300 according to embodiments of the present disclosure. The processing system 300 generally includes a factory interface 302, load lock chambers 304, 306, transfer chambers 308, 310 with respective transfer robots 312, 314, holding chambers 316, 318, and processing chambers 320, 322, 324, 326, 328, 330. As detailed herein, wafers in the processing system 300 can be processed in and transferred between the various chambers without exposing the wafers to an ambient environment exterior to the processing system 300 (e.g., an atmospheric ambient environment such as may be present in a fab). For example, the wafers can be processed in and transferred between the various chambers in a low pressure (e.g., less than or equal to about 300 Torr) or vacuum environment without breaking the low pressure or vacuum environment between various processes performed on the wafers in the processing system 300. Accordingly, the processing system 300 may provide for an integrated solution for some processing of wafers.

Examples of a processing system that may be suitably modified in accordance with the teachings provided herein include the Endura®, Producer®, or Centura® integrated processing systems or other suitable processing systems commercially available from Applied Materials, Inc., located in Santa Clara, California. It is contemplated that other processing systems (including those from other manufacturers) may be adapted to benefit from aspects described herein.

In the illustrated example of FIG. 3, the factory interface 302 includes a docking station 340 and factory interface robots 342 to facilitate transfer of wafers. The docking station 340 is configured to accept one or more front opening unified pods (FOUPs) 344. In some examples, each factory interface robot 342 generally comprises a blade 348 disposed on one end of the respective factory interface robot 342 configured to transfer the wafers from the factory interface 302 to the load lock chambers 304, 306.

The load lock chambers 304, 306 have respective ports 350, 352 coupled to the factory interface 302 and respective ports 354, 356 coupled to the transfer chamber 308. The transfer chamber 308 further has respective ports 358, 360 coupled to the holding chambers 316, 318 and respective ports 362, 364 coupled to processing chambers 320, 322. Similarly, the transfer chamber 310 has respective ports 366, 368 coupled to the holding chambers 316, 318 and respective ports 370, 372, 374, 376 coupled to processing chambers 324, 326, 328, 330. The ports 354, 356, 358, 360, 362, 364, 366, 368, 370, 372, 374, 376 can be, for example, slit valve openings with slit valves for passing wafers therethrough by the transfer robots 312, 314 and for providing a seal between respective chambers to prevent a gas from passing between the respective chambers. Generally, any port is open for transferring a wafer therethrough. Otherwise, the port is closed.

The load lock chambers 304, 306, transfer chambers 308, 310, holding chambers 316, 318, and processing chambers 320, 322, 324, 326, 328, 330 may be fluidly coupled to a gas and pressure control system (not specifically illustrated). The gas and pressure control system can include one or more gas pumps (e.g., turbo pumps, cryo-pumps, roughing pumps), gas sources, various valves, and conduits fluidly coupled to the various chambers. In operation, a factory interface robot 342 transfers a wafer from a FOUP 344 through a port 350 or 352 to a load lock chamber 304 or 306. The gas and pressure control system then pumps down the load lock chamber 304 or 306. The gas and pressure control system further maintains the transfer chambers 308, 310 and holding chambers 316, 318 with an interior low pressure or vacuum environment (which may include an inert gas). Hence, the pumping down of the load lock chamber 304 or 306 facilitates passing the wafer between, for example, the atmospheric environment of the factory interface 302 and the low pressure or vacuum environment of the transfer chamber 308.

With the wafer in the load lock chamber 304 or 306 that has been pumped down, the transfer robot 312 transfers the wafer from the load lock chamber 304 or 306 into the transfer chamber 308 through the port 354 or 356. The transfer robot 312 is then capable of transferring the wafer to and/or between any of the processing chambers 320, 322 through the respective ports 362, 364 for processing and the holding chambers 316, 318 through the respective ports 358, 360 for holding to await further transfer. Similarly, the transfer robot 314 is capable of accessing the wafer in the holding chamber 316 or 318 through the port 366 or 368 and is capable of transferring the wafer to and/or between any of the processing chambers 324, 326, 328, 330 through the respective ports 370, 372, 374, 376 for processing and the holding chambers 316, 318 through the respective ports 366, 368 for holding to await further transfer. The transfer and holding of the wafer within and among the various chambers can be in the low pressure or vacuum environment provided by the gas and pressure control system.

The processing chambers 320, 322, 324, 326, 328, 330 can be any appropriate chamber for processing a wafer. In some embodiments, the processing chamber 320 can be capable of performing an annealing process, the processing chamber 322 can be capable of performing a cleaning process, and the processing chambers 324, 326, 328, 330 can be capable of performing epitaxial growth processes. In some examples, the processing chamber 322 can be capable of performing a cleaning process, the processing chamber 320 can be capable of performing an etch process, and the processing chambers 324, 326, 328, 330 can be capable of performing respective epitaxial growth processes. The processing chamber 322 may be a SiCoNi™ Preclean chamber available from Applied Materials of Santa Clara, Calif. The processing chamber 320 may be a Selectra™ Etch chamber available from Applied Materials of Santa Clara, Calif.

A system controller 390 is coupled to the processing system 300 for controlling the processing system 300 or components thereof. For example, the system controller 390 may control the operation of the processing system 300 using a direct control of the chambers 304, 306, 308, 316, 318, 310, 320, 322, 324, 326, 328, 330 of the processing system 300 or by controlling controllers associated with the chambers 304, 306, 308, 316, 318, 310, 320, 322, 324, 326, 328, 330. In operation, the system controller 390 enables data collection and feedback from the respective chambers to coordinate performance of the processing system 300.

The system controller 390 generally includes a central processing unit (CPU) 392, memory 394, and support circuits 396. The CPU 392 may be one of any form of a general-purpose processor that can be used in an industrial setting. The memory 394, or non-transitory computer-readable medium, is accessible by the CPU 392 and may be one or more of memory such as random-access memory (RAM), read only memory (ROM), floppy disk, hard disk, or any other form of digital storage, local or remote. The support circuits 396 are coupled to the CPU 392 and may comprise cache, clock circuits, input/output subsystems, power supplies, and the like. The various methods disclosed herein may generally be implemented under the control of the CPU 392 by the CPU 392 executing computer instruction code stored in the memory 394 (or in memory of a particular process chamber) as, for example, a software routine. When the computer instruction code is executed by the CPU 392, the CPU 392 controls the chambers to perform processes in accordance with the various methods.

Other processing systems can be in other configurations. For example, more or fewer processing chambers may be coupled to a transfer apparatus. In the illustrated example, the transfer apparatus includes the transfer chambers 308, 310 and the holding chambers 316, 318. In other examples, more or fewer transfer chambers (e.g., one transfer chamber) and/or more or fewer holding chambers (e.g., no holding chambers) may be implemented as a transfer apparatus in a processing system.

Processes may generally be stored in the memory of the system controller 390 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

Embodiments of the disclosure are directed to a non-transitory computer readable medium. In one or more embodiments, the non-transitory computer readable medium includes instructions that, when executed by a controller of a processing chamber, causes a processing chamber to perform the operations of any of the methods (e.g., deposition method 100) described herein. In one or more embodiments, the controller causes a processing chamber to perform the operations of deposition method 100. In one or more embodiments, the controller causes the processing chamber to perform the operations of depositing a second metal material on a substrate surface having at least one feature therein (operation 110). The at least one feature comprises at least one surface defining a via having a bottom surface and at least one sidewall. In one or more embodiments, the controller causes the processing chamber to perform the operations of exposing to a first metal halide and a reductant to form a first metal gapfill within the at least one feature (operation 120).

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of depositing molybdenum gapfill, the method comprising:
   exposing a substrate surface with at least one feature formed therein to a first molybdenum precursor and a reductant to form a first gapfill within the at least one feature, the at least one feature having an opening, two sidewalls and extending a depth from a top surface to a bottom surface, the first gapfill having a top thickness on the top surface of at least 20 Ångstroms and a bottom thickness on the bottom surface of at least 10 Ångstroms and the top thickness is greater than the bottom thickness;

exposing the substrate surface to a second molybdenum halide precursor to remove a portion of the first gapfill to reduce the top thickness and the bottom thickness, and the top thickness is reduced by a greater amount than the bottom thickness; and
repeating formation of the first gapfill.

2. The method of claim 1, wherein the opening has a width in a range of 5 nm to 35 nm and an aspect ratio of the at least one feature is greater than or equal to about 20:1.

3. The method of claim 2, wherein the opening has a width in a range of 5 nm to 15 nm and the aspect ratio of the at least one feature is greater than or equal to about 50:1.

4. The method of claim 2, wherein the first gapfill is entirely removed from the top surface.

5. The method of claim 1, wherein the at least one feature forms a memory cell of DRAM.

6. The method of claim 1, wherein the first gapfill is formed by a CVD process.

7. The method of claim 6, wherein the CVD process is performed without plasma.

8. The method of claim 1, wherein the first molybdenum precursor comprises an oxyhalide.

9. The method of claim 8, wherein the first molybdenum precursor consists essentially of $MoO_2Cl_2$.

10. The method of claim 9, wherein the second molybdenum halide precursor consists essentially of $MoCl_5$.

11. The method of claim 1, wherein the substrate is maintained at a temperature in a range of about 500° C. to about 600° C. during formation of the first gapfill.

12. The method of claim 1, wherein the substrate surface is purged after formation of the first gapfill and before exposure to the second molybdenum halide precursor.

13. The method of claim 1, wherein removing the portion of the first gapfill removes a thickness in a range of about 10 Å to about 50 Å.

14. The method of claim 1, wherein the portion of the first gapfill is removed from near the top of the at least one feature and the method forms the first gapfill in a bottom-up fashion.

15. The method claim 1, wherein the first gapfill contains voids and removing a portion of the first gapfill removes the voids.

16. The method of claim 15, wherein the method forms a molybdenum gapfill without substantial voids.

17. The method of claim 1, wherein the substrate surface is purged after exposure to the second molybdenum halide precursor and before repeating formation of the first gapfill.

18. The method of claim 1, further comprising repeating formation and removal of the first gapfill to fill the at least one feature.

19. The method of claim 18, wherein formation and removal form a dep-etch cycle and a number of cycles in a range of about 200 to about 400 are performed.

20. A method of depositing molybdenum gapfill, the method comprising:
   exposing a substrate surface with at least one feature formed therein to $MoO_2Cl_2$ and $H_2$ to form a first gapfill within the at least one feature, the at least one feature having an opening, two sidewalls and extending a depth from a top surface to a bottom surface, the first gapfill having a top thickness on the top surface of at least 20 Ångstroms and a bottom thickness on the bottom surface of at least 10 Ångstroms and the top thickness is greater than the bottom thickness;
   exposing the substrate surface to $MoCl_5$ to remove a portion of the first gapfill to reduce the top thickness and the bottom thickness, and the top thickness is reduced by a greater amount than the bottom thickness; and repeating formation and removal of the first gapfill to entirely fill the at least one feature in a bottom-up fashion.

* * * * *